(12) United States Patent
Shimizu et al.

(10) Patent No.: US 9,281,465 B2
(45) Date of Patent: Mar. 8, 2016

(54) PIEZOELECTRIC ELEMENT AND METHOD OF MANUFACTURING THE SAME

(71) Applicant: TAIYO YUDEN CO., LTD., Taito-ku, Tokyo (JP)

(72) Inventors: Hiroyuki Shimizu, Takasaki (JP); Keiichi Hatano, Takasaki (JP); Yutaka Doshida, Takasaki (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 331 days.

(21) Appl. No.: 13/903,737

(22) Filed: May 28, 2013

(65) Prior Publication Data

US 2014/0028156 A1    Jan. 30, 2014

(30) Foreign Application Priority Data

Jul. 24, 2012  (JP) ................. 2012-163598

(51) Int. Cl.
    *H01L 41/187*    (2006.01)
    *H01L 41/273*    (2013.01)

(52) U.S. Cl.
    CPC .......... *H01L 41/187* (2013.01); *H01L 41/1873* (2013.01); *H01L 41/273* (2013.01)

(58) Field of Classification Search
    CPC ........................................................ B41J 2/161
    USPC ........................................ 310/363–366, 358
    See application file for complete search history.

(56) References Cited

U.S. PATENT DOCUMENTS

| | | | |
|---|---|---|---|
| 7,381,464 B2 * | 6/2008 | Ito | C04B 35/62645 428/402 |
| 2003/0178605 A1 | 9/2003 | Nonoyama et al. | |
| 2009/0243439 A1 | 10/2009 | Furukawa et al. | |
| 2010/0102679 A1 | 4/2010 | Kawada | |
| 2011/0068890 A1 * | 3/2011 | Yang et al. | 338/22 R |
| 2011/0156540 A1 | 6/2011 | Hatano et al. | |
| 2012/0154977 A1 * | 6/2012 | Hur et al. | 361/303 |
| 2013/0106960 A1 | 5/2013 | Wang | |
| 2014/0083755 A1 * | 3/2014 | Lee | H05K 1/181 174/260 |

(Continued)

FOREIGN PATENT DOCUMENTS

| | | |
|---|---|---|
| DE | 102007000730 A1 | 4/2008 |
| EP | 1630831 A2 | 3/2006 |

(Continued)

OTHER PUBLICATIONS

A Notice of Reasons for Refusal issued by Japanese Patent Office, mailed Apr. 1, 2014, for Japanese counterpart application No. 2012-163598.

The Extended European Search Report (EESR) issued by the European Patent Office, mailed Nov. 11, 2013, for European counterpart Application No. 13003012.5.

Yasuyoshi Saito et al., Lead-free piezoceramics, Letters to Nature, pp. 84-87, vol. 432, Nov. 4, 2004.

(Continued)

*Primary Examiner* — Thomas Dougherty
(74) *Attorney, Agent, or Firm* — Law Office of Katsuhiro Arai

(57) ABSTRACT

A piezoelectric element includes first internal electrodes and second electrodes, as well as piezoelectric ceramic layers that are made of ceramics and arranged between the first internal electrodes and second internal electrodes. Manganese is present relatively more abundantly in the areas of the piezoelectric ceramic layers adjacent to the first internal electrodes and second internal electrodes, compared to at the centers of the piezoelectric ceramic layers. Insulation performance of the piezoelectric element is kept from dropping over the course of use.

11 Claims, 18 Drawing Sheets

(56) References Cited

U.S. PATENT DOCUMENTS

| | | | | |
|---|---|---|---|---|
| 2014/0339962 A1* | 11/2014 | Furukawa et al. | ............ | 310/363 |
| 2015/0194592 A1* | 7/2015 | Aida et al. | .................... | 310/311 |

FOREIGN PATENT DOCUMENTS

| | | | |
|---|---|---|---|
| EP | 2431343 | A1 | 3/2012 |
| JP | 2002-068825 | A | 3/2002 |
| JP | 2002-208743 | A | 7/2002 |
| JP | 2003-342069 | A | 12/2003 |
| JP | 2004-158494 | A | 6/2004 |
| JP | 2004-300012 | A | 10/2004 |
| JP | WO-2007-074635 A1 * | 7/2007 | ............... H01G 4/12 |
| JP | 2008-098470 A | 4/2008 | |
| JP | 2008-207999 A | 9/2008 | |
| JP | 2010-052999 A | 3/2010 | |
| JP | 2010-180121 A | 8/2010 | |
| JP | 2012-36080 * | 2/2012 | ............ C04B 35/468 |
| JP | 2013-098370 A | 5/2013 | |
| WO | 2008/152851 A1 | 12/2008 | |

OTHER PUBLICATIONS

Yiping Guo et al., Phase transitional behavior and piezoelectric properties of (Na0.5K0.5)NbO3—LiNbO3 ceramics, Applied Physics Letters, pp. 4121-4123, vol. 85, No. 18, Nov. 1, 2004.

\* cited by examiner

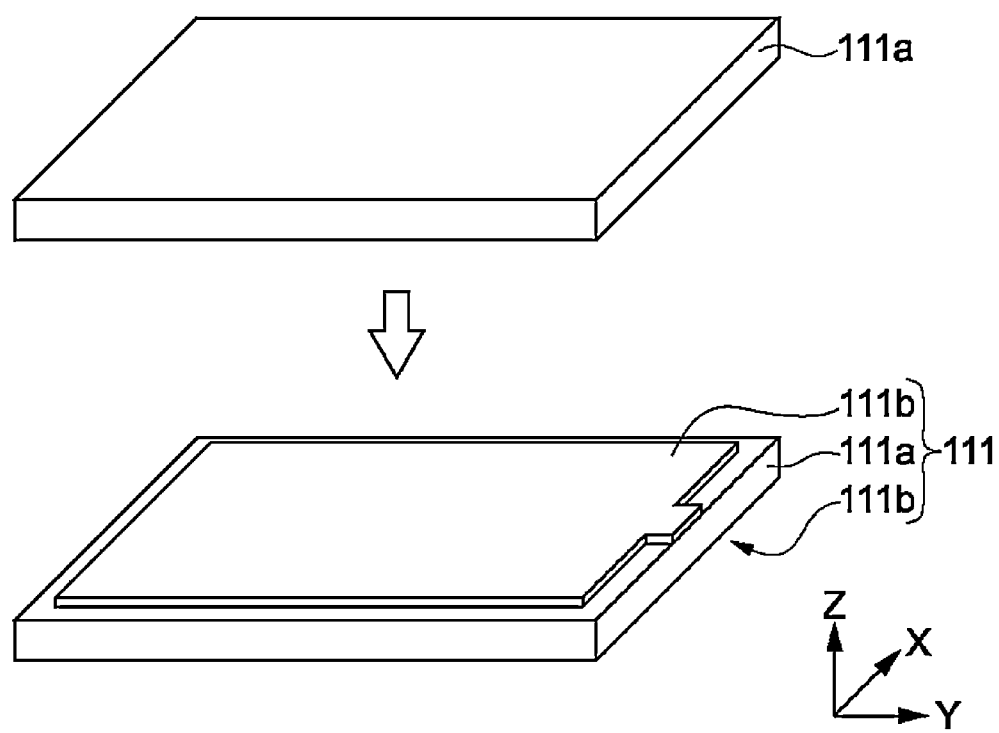

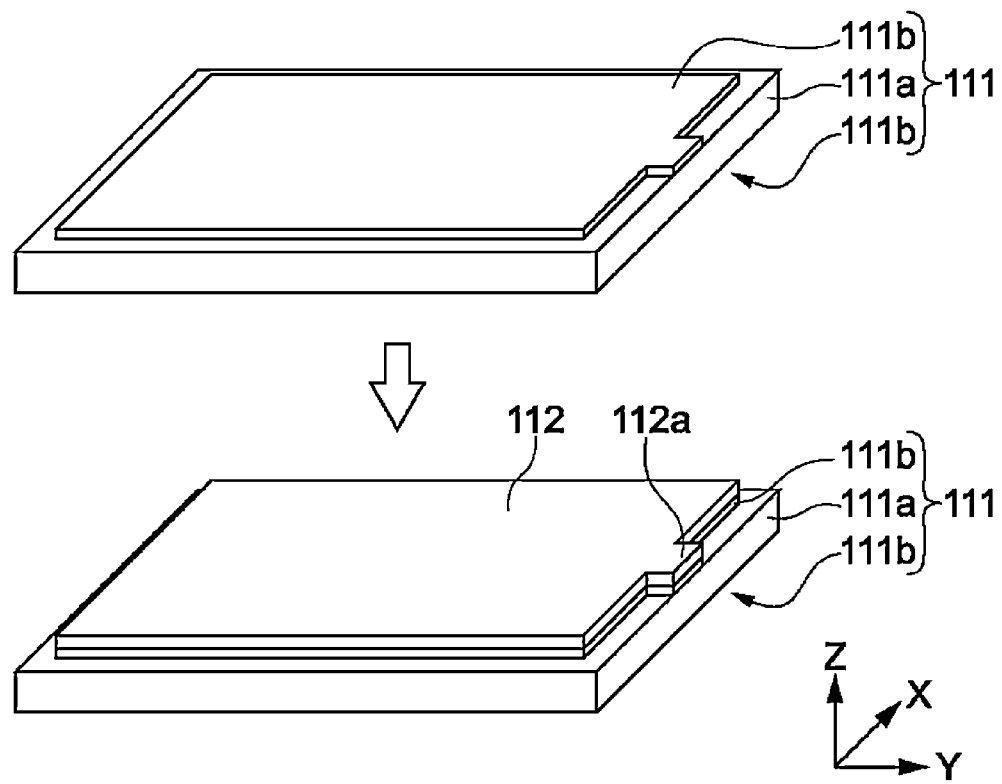

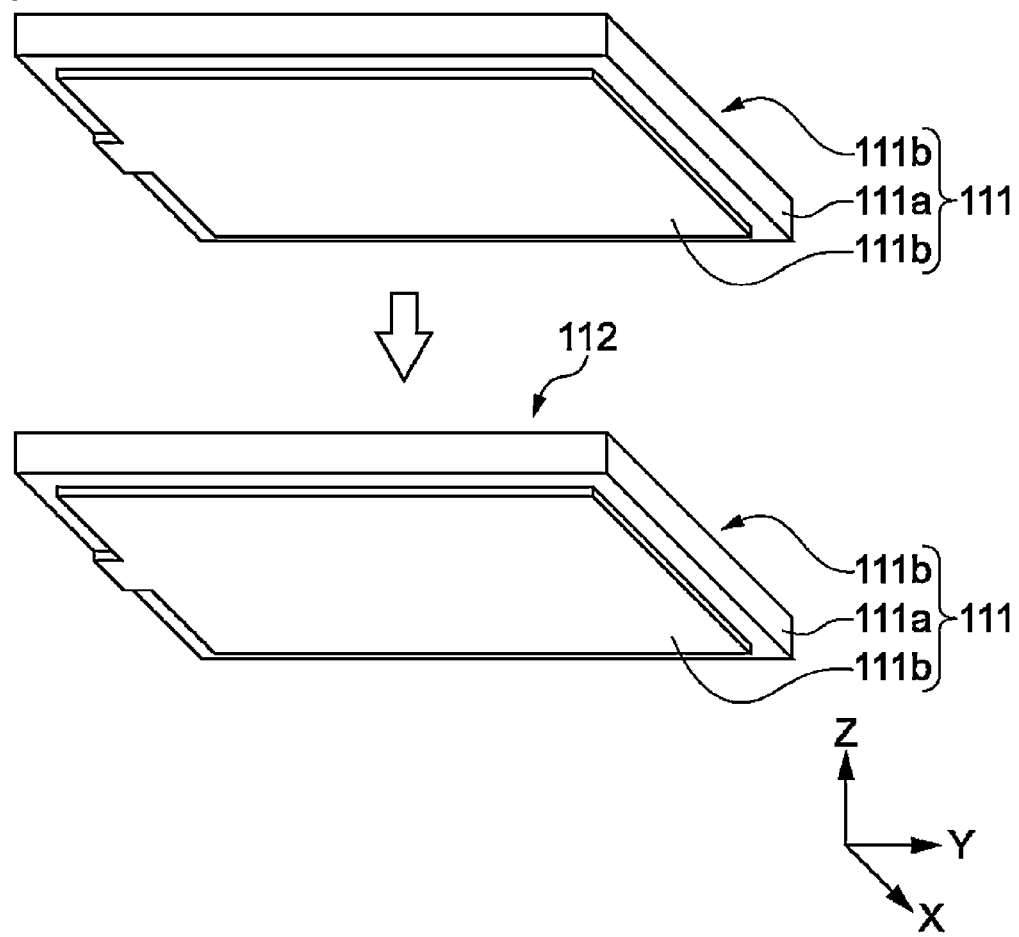

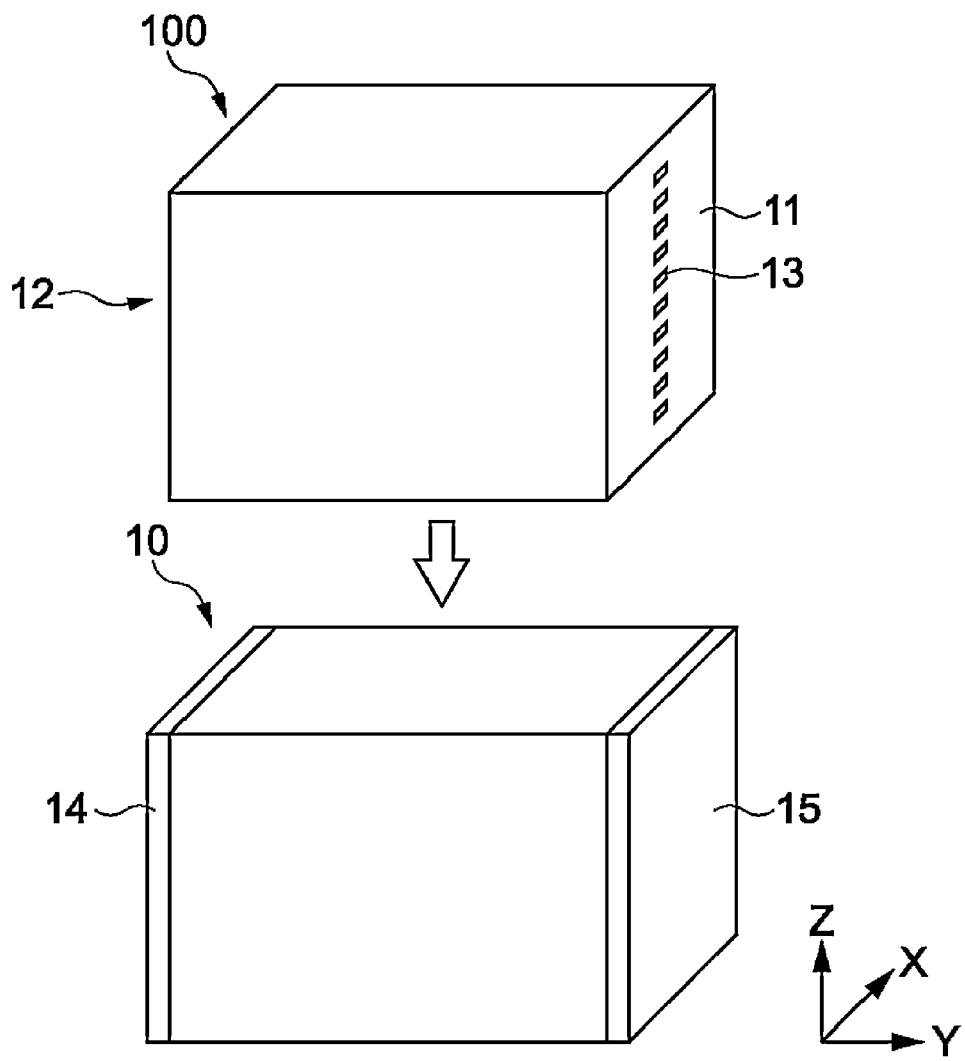

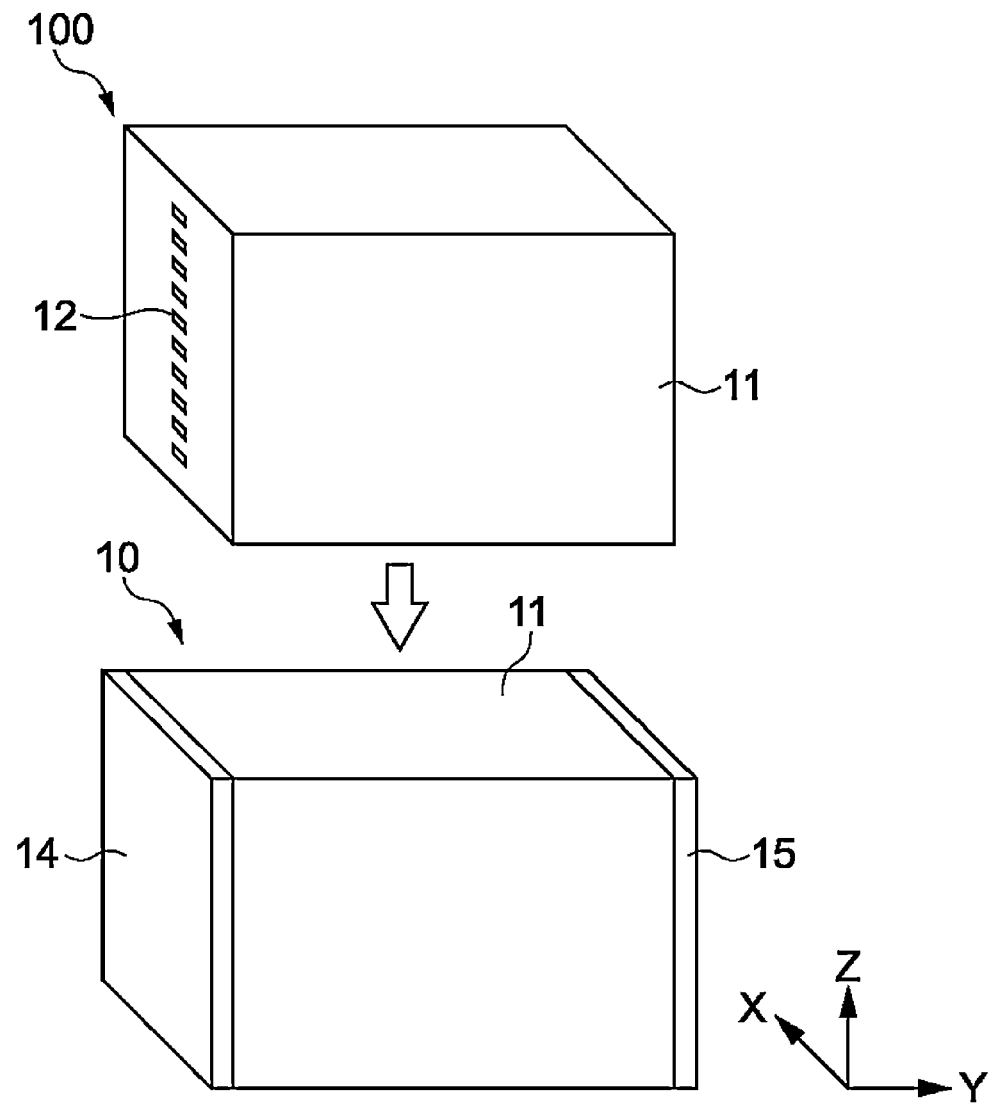

PIEZOELECTRIC ELEMENT AND METHOD OF MANUFACTURING THE SAME

BACKGROUND

1. Field of the Invention

The present invention relates to a piezoelectric element containing Pb-free piezoelectric ceramics, as well as a manufacturing method thereof.

2. Description of the Related Art

Piezoelectric ceramics are used as piezoelectric elements. Piezoelectric elements are used as sensor elements, generation elements, and the like, by applying the piezoelectric effect of converting mechanical energy to electrical energy. Piezoelectric elements are also used as vibrators, sound generators, actuators, ultrasonic motors, etc., that apply the reverse-piezoelectric effect of converting electrical energy to mechanical energy. In addition, piezoelectric elements are used as circuit elements, vibration control elements, etc., by combining the piezoelectric effect and reverse-piezoelectric effect.

In general, a piezoelectric element has a structure comprising layered piezoelectric ceramic sheets and internal electrodes placed between the layers. A piezoelectric element has two terminals and its internal electrodes are connected alternately to the different terminals. This way, voltage is applied to each piezoelectric ceramic layer when voltage is applied between the terminals.

For high-performance piezoelectric ceramics, PZT material expressed by the composition formula $Pb(Zr,Ti)O_3$—$PbTiO_3$, and PLZT material expressed by the composition formula $(Pb,La)(Zr,Ti)O_3$—$PbTiO_3$, are widely known. However, both of these piezoelectric ceramics, while offering high piezoelectric characteristics, contain Pb that imposes significant burdens on the environment.

Among Pb-free piezoelectric ceramics that do not contain Pb, piezoelectric ceramics having a perovskite structure of alkali-containing niobate (refer to Patent Literatures 1 to 7 and Non-patent Literatures 1 and 2) or of barium titanate (refer to Patent Literature 8) are known as offering relatively good performance.

In particular, Patent Literature 7 discloses a piezoelectric ceramic offering improved piezoelectric characteristics, achieved by dispersing a sub phase containing the composition $K_3Nb_3O_6Si_2O_7$ in the main phase of alkali-containing niobate perovskite structure and thereby producing a dense structure constituted by grains of uniform size.

BACKGROUND ART LITERATURE

Patent Literature

[Patent Literature 1] Japanese Patent Laid-open No. 2002-068825
[Patent Literature 2] Japanese Patent Laid-open No. 2003-342069
[Patent Literature 3] Japanese Patent Laid-open No. 2004-300012
[Patent Literature 4] Japanese Patent Laid-open No. 2008-207999
[Patent Literature 5] International Patent Laid-open No. 2008/152851
[Patent Literature 6] Japanese Patent Laid-open No. 2010-180121
[Patent Literature 7] Japanese Patent Laid-open No. 2010-052999
[Patent Literature 8] Japanese Patent Laid-open No. 2002-208743

Non-patent Literatures

[Non-patent Literature 1] Nature, 432 (4), 2004, pp. 84-87
[Non-patent Literature 2] Applied Physics Letters 85 (18), 2004, pp. 4121-4123

SUMMARY

Piezoelectric elements are required to have high insulation characteristics between their internal electrodes, or specifically high insulation characteristics of their piezoelectric ceramic layers. The piezoelectric ceramic disclosed in Cited Literature 7 has a fine structure and consequently many grain boundaries in the direction in which voltage is applied. Since piezoelectric ceramics generally have higher insulation property at the grain boundaries than inside the crystal grains, the aforementioned piezoelectric ceramic provides good insulation characteristics desired of piezoelectric ceramic layers constituting piezoelectric elements.

However, piezoelectric elements are subject to a drop in insulation characteristics if any one of their piezoelectric layers undergoes dielectric breakdown as a result of deterioration of the piezoelectric ceramic layer occurring over the course of use. However, it is desired that piezoelectric elements maintain high insulation characteristics for a long period.

In light of the situations mentioned above, an object of the present invention is to provide a piezoelectric element whose insulation performance is kept from dropping over the course of use, as well as a manufacturing method of such piezoelectric element.

Any discussion of problems and solutions involved in the related art has been included in this disclosure solely for the purposes of providing a context for the present invention, and should not be taken as an admission that any or all of the discussion were known at the time the invention was made.

To achieve the aforementioned object, a piezoelectric element pertaining to an embodiment of the present invention comprises first internal electrodes and second internal electrodes, as well as piezoelectric ceramic layers that are made of ceramic and arranged between the first internal electrodes and second internal electrodes.

Manganese is present relatively more abundantly in the areas of the piezoelectric ceramic layers adjacent to the first internal electrodes and second internal electrodes, compared to at the centers of the piezoelectric ceramic layers.

A manufacturing method of piezoelectric element pertaining to an embodiment of the present invention comprises: forming ceramic sheets containing manganese element; dispersing crystal containing manganese element on both sides of the ceramic sheets; applying an electrode paste to the ceramic sheets on which the crystal containing manganese element has been dispersed, to form electrodes; laminating the ceramic sheets having the electrodes formed on them, to form a laminate; and sintering the laminate.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

[FIG. 4A] is a schematic drawing illustrating the manganese dispersion step performed to make the piezoelectric element shown in FIG. 2A.

[FIG. 5A] is a schematic drawing illustrating the internal electrode paste application step performed to make the piezoelectric element shown in FIG. 2A.

[FIG. 5B] is a schematic drawing illustrating the internal electrode paste application step performed to make the piezoelectric element shown in FIG. 2A.

[FIG. 7A] is a schematic drawing illustrating the external electrode forming step performed to make the piezoelectric element shown in FIG. 2A.

[FIG. 7B] is a schematic drawing illustrating the external electrode forming step performed to make the piezoelectric element shown in FIG. 2A.

DESCRIPTION OF THE SYMBOLS

Figure 1:
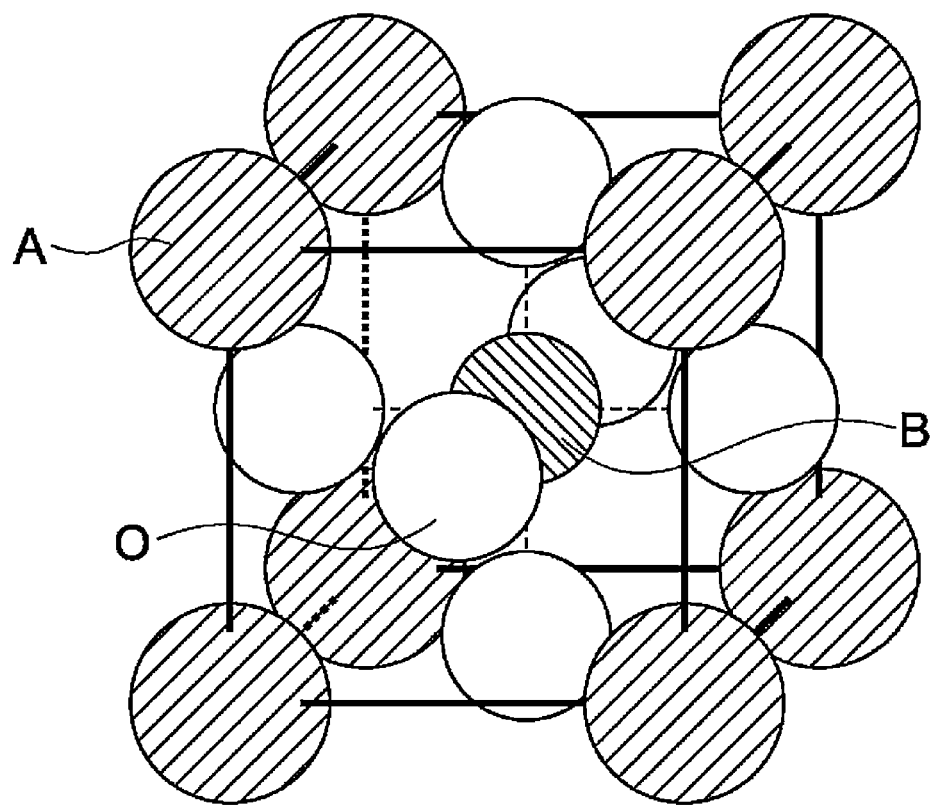
[FIG. 1] is a schematic diagram of the unit lattice of a perovskite structure.

10: Piezoelectric element
11: Piezoelectric ceramics
11b: Manganese-rich phase
12, 13: Internal electrodes
14, 15: External electrodes

DETAILED DESCRIPTION OF EMBODIMENTS

A piezoelectric element pertaining to an embodiment of the present invention comprises first internal electrodes and second internal electrodes, as well as piezoelectric ceramic layers that are made of ceramics and arranged between the first internal electrodes and second internal electrodes.

Manganese is present relatively more abundantly in the areas of the piezoelectric ceramic layers adjacent to the first internal electrodes and second internal electrodes, compared to at the centers of the piezoelectric ceramic layers. With a piezoelectric element of this structure, its insulation performance is kept from dropping over the course of use.

The aforementioned areas may extend over the entire surfaces of the first electrodes and second electrodes. With a piezoelectric element of this structure, its insulation performance is more effectively kept from dropping over the course of use.

Manganese may be present at the grain boundaries of the ceramics, especially at crystal grain triple points. With a piezoelectric element of this structure, its insulation performance is kept from dropping over the course of use without the piezoelectric effect being obstructed in any way.

The piezoelectric ceramic layers may have crystals containing manganese as mentioned above.

The piezoelectric ceramic layers may also have crystals containing manganese unevenly distributed over the aforementioned areas. Additionally, the crystals containing manganese may be crystals whose mother phase is MnO. Moreover, the crystals containing manganese in the piezoelectric ceramic layers may have an average grain size of 0.1 μm or more but 5 μm or less. With a piezoelectric element of this structure, its insulation performance is kept from dropping over the course of use without the piezoelectric effect being obstructed in any way.

The piezoelectric element may also have a first external electrode and second external electrode, with the first internal electrodes and second internal electrodes placed alternately via the piezoelectric ceramic layers and the first internal electrodes each connected to the first external electrode, while the second internal electrodes each connected to the second external electrode. A piezoelectric element of this structure offers excellent piezoelectric characteristics because it has a so-called layered structure.

The piezoelectric ceramic layers may have a thickness of 10 μm or more but 60 μm or less. With a piezoelectric element of this structure, the electric field intensity with which to drive the piezoelectric element can be changed to various levels according to the input voltage, by determining the thickness of the piezoelectric ceramic layers as deemed appropriate within the aforementioned range, and this widens the selection range for the electric field intensity.

The piezoelectric ceramic layers may have an alkali-containing niobate perovskite structure as its main phase.

Also, the main phase may be one expressed by the composition formula $(Li_xNa_yK_{1-x-y})_a(Nb_{1-z}Ta_z)O_3$ (in the formula, $0.04<x\le0.1$, $0\le y\le1$, $0\le z\le0.4$, $0.95\le a\le1.01$, and $x+y<1$). With a piezoelectric element of this structure, excellent piezoelectric characteristics can be achieved because a piezoelectric composition of high piezoelectric characteristics is used as its main phase.

The piezoelectric ceramic layers contain manganese at a ratio of 0.2 mol or more but 2.0 mol or less relative to 100 mol of the main phase. A piezoelectric element of this structure offers excellent insulation property due to the action of the phase containing manganese in the piezoelectric ceramic layers.

The piezoelectric ceramic layers may contain silicon at a ratio of 0.2 mol or more but 3.0 mol or less relative to 100 mol of the main phase. A piezoelectric element of this structure offers excellent insulation performance and mechanical strength because the piezoelectric ceramic layers have a dense and uniform structure.

A manufacturing method of a piezoelectric element pertaining to an embodiment of the present invention comprises: forming ceramic sheets containing manganese; dispersing crystals containing manganese on both sides of the ceramic sheets; applying an electrode paste to the ceramic sheets on which the crystals containing manganese have been dispersed, to form electrodes; laminating the ceramic sheets having the electrodes formed on them, to form a laminate; and sintering the laminate. With a piezoelectric element manufactured according to this structure, its insulation performance is kept from dropping over the course of use.

An embodiment of the present invention is explained below by referring to the drawings. The X-axis, Y-axis and Z-axis, which are mutually orthogonal, are shown in the drawings as deemed appropriate. The X-axis, Y-axis and Z-axis are the same in all drawings.

[Piezoelectric Ceramics]

First, study results of the composition of a piezoelectric ceramic used for the piezoelectric element pertaining to this embodiment are explained.

(Main Phase)

For the piezoelectric ceramic pertaining to this embodiment, a piezoelectric ceramic whose main phase comprises an alkali-containing niobate perovskite structure was used. To be specific, the piezoelectric ceramic is constituted by a polycrystalline expressed by Composition Formula (1) below:

$$(Li_xNa_yK_{1-x-y})_a(Nb_{1-z}Ta_z)O_3 \quad (1)$$

FIG. 1 is a model of the unit lattice of a perovskite structure. A perovskite structure is expressed by the composition formula $ABO_3$, comprising the atoms conformationally positioned at site A, atoms conformationally positioned at site B, and oxygen (O) atoms. As shown in FIG. 1, in a perovskite structure six oxygen atoms are arranged around the atoms at site B, 12 oxygen atoms are arranged around the atoms at site A, and these structures are repeated cyclically to form crystals.

In the piezoelectric ceramic pertaining to this embodiment, Li, Na, and K, all of which are alkali metals, are conformationally positioned at site A in FIG. 1, while Nb and Ta are conformationally positioned at site B. A perovskite structure is theoretically stable, or in a state where the respective atoms are conformationally positioned at all site A's and site B's, when the stoichiometric ratio of A:B=1:1 is satisfied. To be specific, this is a state where a in Composition Formula (1) is equal to 1.

In reality, however, the elements conformationally positioned at site A, or specifically Li, Na, and K, are prone to deficiency due to volatilization during sintering, etc., and specifically they may decrease by around several percent to two percent from the level in the stoichiometric composition. Accordingly, it is possible to obtain a stable perovskite structure close to the stoichiometric composition by predicting the deficiencies in Li, Na, and K and increasing Li, Na, and K accordingly from the levels in the stoichiometric composition in the initial composition (composition when weighed). To be specific, it is known that a stable perovskite structure can be obtained when the range of a in Composition Formula (1) is $0.95 \leq a \leq 1.01$.

It is also known that good piezoelectric characteristics can be achieved when the ranges of x and y in Composition Formula (1) that determine the ratio of elements conformationally positioned at site A are $0.04 < x \leq 0.1$ and $0 \leq y \leq 1$, respectively, while the range of z that determines the ratio of elements conformationally positioned at site B is $0 \leq z \leq 0.4$. Needless to say, the sum of x and y in Composition Formula (1) must satisfy $x+y<1$.

(Sub Phase)

The piezoelectric ceramic pertaining to this embodiment may be constituted in such a way that a sub phase is dispersed in the main phase. Examples of the sub phase include a manganese-containing phase, silicon-containing phase, lithium-containing phase, alkali-earth-metal-containing phase and zirconium-containing phase, among others.

(1) Manganese (Mn)-containing Phase

Insulation characteristics of piezoelectric ceramics can be improved by dispersing a manganese-containing phase as a sub phase. In the meantime, the manganese-containing phase itself does not contribute to piezoelectric characteristics, which means that piezoelectric characteristics of piezoelectric ceramics will drop if the manganese-containing phase, which is a sub phase, is excessive relative to the main phase.

As explained in detail later, in this embodiment a manganese-containing phase is intentionally distributed unevenly inside the piezoelectric ceramic to improve the insulation performance of the piezoelectric element while maintaining its piezoelectric characteristics. The manganese-containing phase, which is primarily present in a state of MnO, may also be present in a state of $MnO_2$ or $Mn_3O_4$. Furthermore, the manganese-containing phase need not constitute crystals, but it can also be present as an amorphous phase.

(2) Silicon (Si)-containing Phase

Growth of crystal grains can be suppressed when a piezoelectric ceramic is sintered, by dispersing a silicon-containing phase as a sub phase. Accordingly, a piezoelectric ceramic having a main phase of uniform fine crystal structure can be obtained by dispersing a silicon-containing phase as a sub phase. The finer the crystals of the piezoelectric ceramic, the higher the quantity of the grain boundaries found in the unit volume of piezoelectric ceramic become. As a result, the insulation characteristics of the piezoelectric ceramic will improve, and so will its mechanical strength. In the meantime, the silicon-containing phase itself does not contribute to piezoelectric characteristics, which means that piezoelectric characteristics of a piezoelectric ceramic will drop if the silicon-containing phase, which is a sub phase, is excessive relative to the main phase. It is known that a favorable content of silicon-containing phase is 0.2 mol or more but 3.0 mol or less of silicon relative to 100 mol of the main phase.

The silicon-containing phase may be present in a state of $SiO_2$, but preferably it is present in a state of $K_3Nb_3O_6Si_2O_7$. To obtain a piezoelectric ceramic with $K_3Nb_3O_6Si_2O_7$ present as a sub phase, a method can be adopted whereby a $K_3Nb_3O_6Si_2O_7$ powder is prepared separately from the powder of main phase and a mixed powder comprising this powder and powder of the main phase is sintered. Another method that can be adopted is to separate $K_3Nb_3O_6Si_2O_7$ when a mixed powder comprising the powder of main phase and $SiO_2$ powder is sintered.

(3) Lithium (Li)-containing Phase

It is known that sintering property of piezoelectric ceramic can be improved by using $Li_2O$ or $Li_2CO_3$ as a sintering auxiliary when the piezoelectric ceramic is sintered. This is specifically because the Li contained in $Li_2O$ or $Li_2CO_3$ acts in a manner compensating for the deficiencies in the elements at site A during sintering.

If $Li_2O$ or $Li_2CO_3$ is used as a sintering auxiliary, a lithium-containing phase may remain in the sintered piezoelectric ceramic as a sub phase. The lithium-containing phase may be present in a state of $Li_2O$, for example. However, it is known that $Li_2O$ or $Li_2CO_3$ used as a sintering auxiliary will improve the sintering property of piezoelectric ceramic without having any negative impact on the characteristics of piezoelectric ceramic as long as its content is 0.1 mol or more but 1.5 mol or less relative to 100 mol of the main phase.

(4) Alkali-earth-metal-containing Phase

It is known that sintering property of piezoelectric ceramic can be improved by using an oxide containing alkali earth metal, as a sintering auxiliary, when the piezoelectric ceramic is sintered. This is specifically because the alkali earth metal contained in this oxide acts in a manner compensating for the deficiencies in the elements at site A, while also compensating for the decreases in valences at site A. Here, at least one of Ca, Ba, and Sr can be adopted for this alkali earth metal.

(5) Other

A zirconium-containing oxide can be added to the piezoelectric ceramic pertaining to this embodiment for the purpose of preventing its insulation property from dropping. Examples of zirconium-containing oxide include $ZrO_2$, among others.

Also, if necessary, a composition containing at least one of Sc, Ti, V, Cr, Fe, Co, Cu, and Zn, all of which are first transition elements, can be added to the piezoelectric ceramic pertaining to this embodiment, for example, for the purpose of controlling the sintering temperature and suppressing the growth of crystal grains.

Furthermore, if necessary, a composition containing at least one of Y, Mo, Ru, Rh and Pd, all of which are second transition elements, can be added to the piezoelectric ceramics pertaining to this embodiment, for example, for the purpose of controlling the sintering temperature, suppressing the growth of crystal grains and extending the longevity in a high electric field.

In addition, if necessary, a composition containing at least one of La, Ce, Pr, Nd, Sm, Eu, Gd, Tb, Dy, Ho, Er, Tm, Yb, Lu, Hf, W, Re, Os, Ir, Pt, and Au, all of which are third transition elements, can be added to the piezoelectric ceramics pertaining to this embodiment, for example, for the purpose of controlling the sintering temperature, suppressing the growth of crystal grains, and extending the longevity in a high electric field.

If necessary, a complex composition comprising transition elements selected from the aforementioned first transition elements, second transition elements, and third transition elements can also be added to the piezoelectric ceramic pertaining to this embodiment.

[Piezoelectric Element]

(Structure of Piezoelectric Element 10)

Figure 2A:
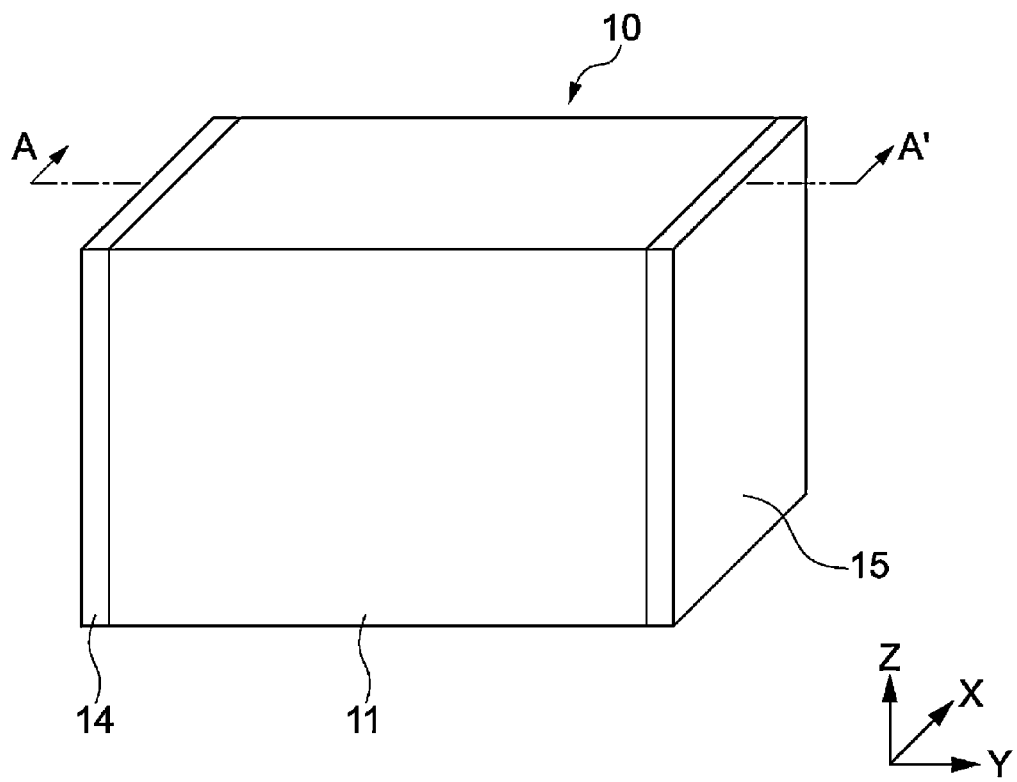
[FIG. 2A] is a perspective view of a piezoelectric element pertaining to an embodiment of the present invention.
Figure 2B:
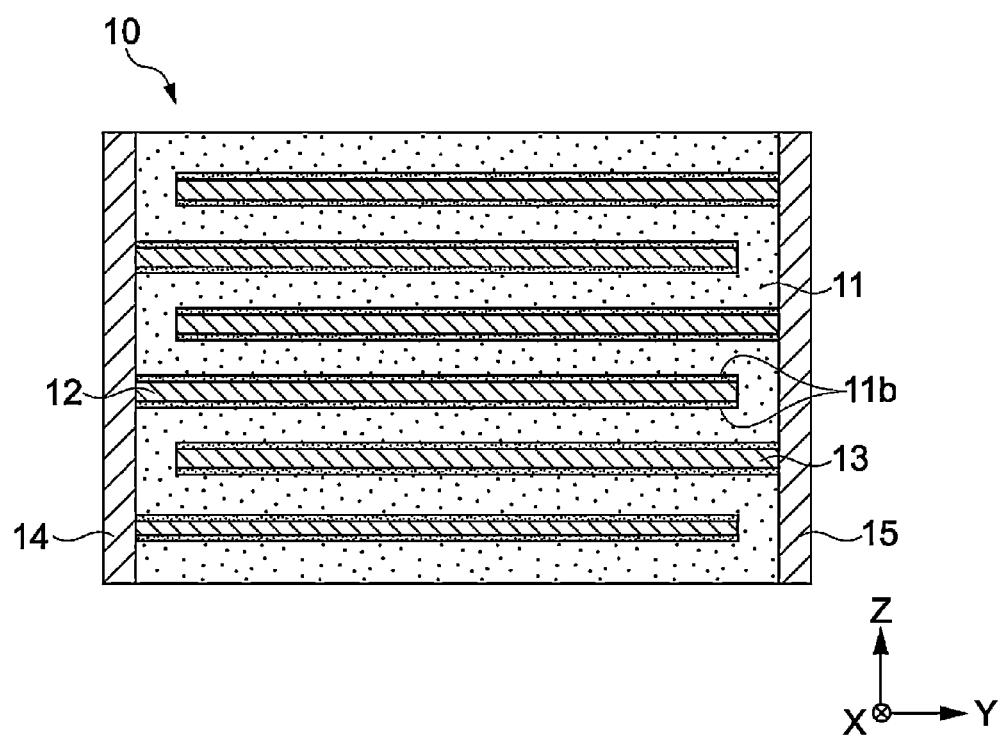
[FIG. 2B] is a section view of the piezoelectric element shown in FIG. 2A, cut along line A-A'.

FIGS. 2A and 2B show the piezoelectric element 10 pertaining to this embodiment, where FIG. 2A is a perspective view, while FIG. 2B is a section view of FIG. 2A, cut along line A-A'.

The piezoelectric element 10 is constituted by a piezoelectric ceramic 11 and external electrodes 14, 15 provided at both ends in the Y-axis direction of the piezoelectric ceramic 11. The piezoelectric element 10 also has two types of internal electrodes 12, 13 that extend in the directions along the XY plane inside the piezoelectric ceramic 11 and are arranged alternately in a manner opposing each other in the Z-axis direction.

The number of internal electrodes 12, 13 can be determined arbitrarily. All of the internal electrodes 12 are connected to the external electrode 14, while all of the internal electrodes 13 are connected to the external electrode 15. The thickness of internal electrodes 12, 13 in the Z-axis direction can be determined as deemed appropriate. For example, the thickness of internal electrodes 12, 13 in the Z-axis direction may be 0.5 μm or more but 2 μm or less.

FIG. 2B shows, as a matter of convenience for illustration purposes, an example where six piezoelectric ceramic 11 layers are arranged between the internal electrodes 12, 13, but the number of piezoelectric ceramic 11 layers can be determined arbitrarily according to the purpose, etc. In other words, there can be any number of piezoelectric ceramic 11 layers as long as there is one or greater.

Also, in the piezoelectric ceramic 11, the top layer and bottom layer in the Z-axis direction, which are not arranged between the internal electrodes 12, 13, do not achieve any piezoelectric effect when the piezoelectric element 10 is used. Accordingly, the top layer and bottom layer of the piezoelectric element 10 in the Z-axis direction need not be constituted by the piezoelectric ceramic 11. Still, preferably the top layer and bottom layer of the piezoelectric element 10 in the Z-axis direction are constituted by insulation material in order to prevent electrical continuity between the external electrodes 14, 15.

The internal electrodes 12, 13 of the piezoelectric element 10 are constituted as Pt electrodes which are conductive layers containing Pt as their main constituent. However, the internal electrodes 12, 13 need not be Pt electrodes, but they can also be Pd electrodes or Ag—Pd electrodes, for example. In addition, the external electrodes 14, 15 of the piezoelectric element 10 are constituted as Ag electrodes which are conductors whose main constituent is Ag. However, the external electrodes 14, 15 need not be Ag electrodes, but they can also be constituted by Pb-free solder, for example.

Because of this structure of the piezoelectric element 10, applying voltage between the external electrodes 14, 15 has the effect of applying voltage between the internal electrodes 12, 13 that are adjacent to each other. Each piezoelectric ceramic 11 layer between the internal electrodes 12, 13 exhibits a varying degree of piezoelectric effect according to the voltage applied between the internal electrodes 12, 13, and deforms by expanding or contracting in the Z-axis direction.

In the piezoelectric ceramic 11 pertaining to this embodiment, areas adjacent to the internal electrodes 12, 13 in the Z-axis direction contain a manganese-rich phase 11b (these areas are specifically where there is an abundance of manganese in the piezoelectric ceramic phase 11, or, in other words, areas to which manganese is unevenly distributed). Here, the areas adjacent to the internal electrodes 12, 13 in the Z-axis direction include the surfaces of piezoelectric ceramic 11 contacting the internal electrodes 12, 13 and extend in the directions along the XY plane. Also, the areas adjacent to the internal electrodes 12, 13 in the Z-axis direction have a certain depth in the Z-axis direction from the surfaces of piezoelectric ceramic 11 contacting the internal electrodes 12, 13 toward the center of the piezoelectric ceramic 11. The depth in the Z-axis direction of the areas adjacent to the internal electrodes 12, 13 in the Z-axis direction may be one-third the thickness of the piezoelectric ceramic 11, for example.

The manganese-rich phase 11b is constituted by the main phase of the piezoelectric ceramic phase 11 in which a manganese-containing phase that contains manganese is dispersed. Accordingly, in the manganese-rich phase 11b a manganese-containing phase offering high insulation property is dispersed in the directions along the XY plane. In other words, in the piezoelectric element 10 a manganese-rich phase 11b is formed in each piezoelectric ceramic 11 layer to intentionally and unevenly distribute manganese in the areas adjacent to the internal electrodes 12, 13.

The manganese-rich phase 11b not only enhances the insulation property between the internal electrodes 12, 13, but it also functions to disperse the electric field applied to the piezoelectric ceramic phase 11 from the internal electrodes 12, 13. This prevents the electric field from concentrating locally in each piezoelectric ceramic 11 layer of the piezoelectric element 10, thereby making each piezoelectric ceramic 11 layer resistant to dielectric breakdown and consequently to insulation failure.

For this reason, the piezoelectric element 10 may be constituted in such a way that manganese is present relatively more abundantly in the areas of piezoelectric ceramic 11 adjacent to the first internal electrodes 12 and second internal electrodes 13, respectively, compared to at the centers of piezoelectric ceramic 11, in order to enhance the aforementioned effects.

On the other hand, each piezoelectric ceramic 11 layer does not diminish its piezoelectric characteristics, at least in the areas other than the manganese-rich phase 11b, due to the presence of manganese. Accordingly, with the piezoelectric element 10 a manganese-rich phase 11b is intentionally formed to keep its insulation performance from dropping over the course of use without sacrificing its piezoelectric characteristics in any way.

Incidentally, as shown in FIG. 2B, preferably a manganese-rich phase 11b is formed in both of the areas adjacent to the internal electrodes 12, 13 in the Z-axis direction. However, the purpose of the art of the present invention can be achieved as long as a manganese-rich phase 11b is formed in at least one of the areas adjacent to the internal electrodes 12, 13.

In the meantime, examples of the manganese-containing phase in the manganese-rich phase 11b include oxides whose mother phase is manganese monoxide (MnO), manganese dioxide ($MnO_2$), or trimanganese tetraoxide ($Mn_3O_4$), among others. The manganese-containing phase need not be an oxide whose mother phase is an oxide containing manganese only, but it can also be an oxide whose mother phase is an oxide constituted by a complete solid solution of manganese and other metal, for example. Additionally, the manganese-containing phase need not be constituted by crystals, but it can also be an amorphous phase.

Desirably the average grain size of the manganese-containing oxide crystals in the manganese-rich phase 11b is 0.1 μm or more but 5 μm or less. If the average grain size of the manganese-containing oxide crystals exceeds 5 μm, electric field response in the main phase may deteriorate and piezoelectric characteristics may drop. If the average grain size of the manganese-containing oxide crystals is less than 0.1 μm, on the other hand, the aforementioned drop in insulation performance cannot be suppressed effectively.

In this embodiment, the crystal grain size was calculated as the so-called area-equivalent size. To be specific, a section of the crystal structure was observed by a SEM (scanning electron microscope) and a circle diameter resulting in an area equivalent to the area of a crystal grain was used as the size of the crystal grain. Alternatively, the average grain size of crystals can be obtained as an average size of crystal grains present in a 100 μm×100 μm area of the crystal structure, for example. Needless to say, the observation area of the crystal structure the observed grains can be selected as deemed appropriate or randomly.

In addition, preferably the thickness of each piezoelectric ceramic 11 layer (referring to the distance between an opposing pair of internal electrodes 12, 13) is 10 μm or more but 60 μm or less. If the thickness of each piezoelectric ceramic 11 layer is less than 10 μm, the electric field intensity becomes too high for the voltage used, which is not desirable. If the thickness of each piezoelectric ceramic 11 layer exceeds 60 μm, on the other hand, the voltage to be used must be increased so as to increase the electric field intensity, which is not desirable, as a step-up circuit or other equipment becomes necessary.

(Manufacturing Method of Piezoelectric Element 10)

Figure 3:
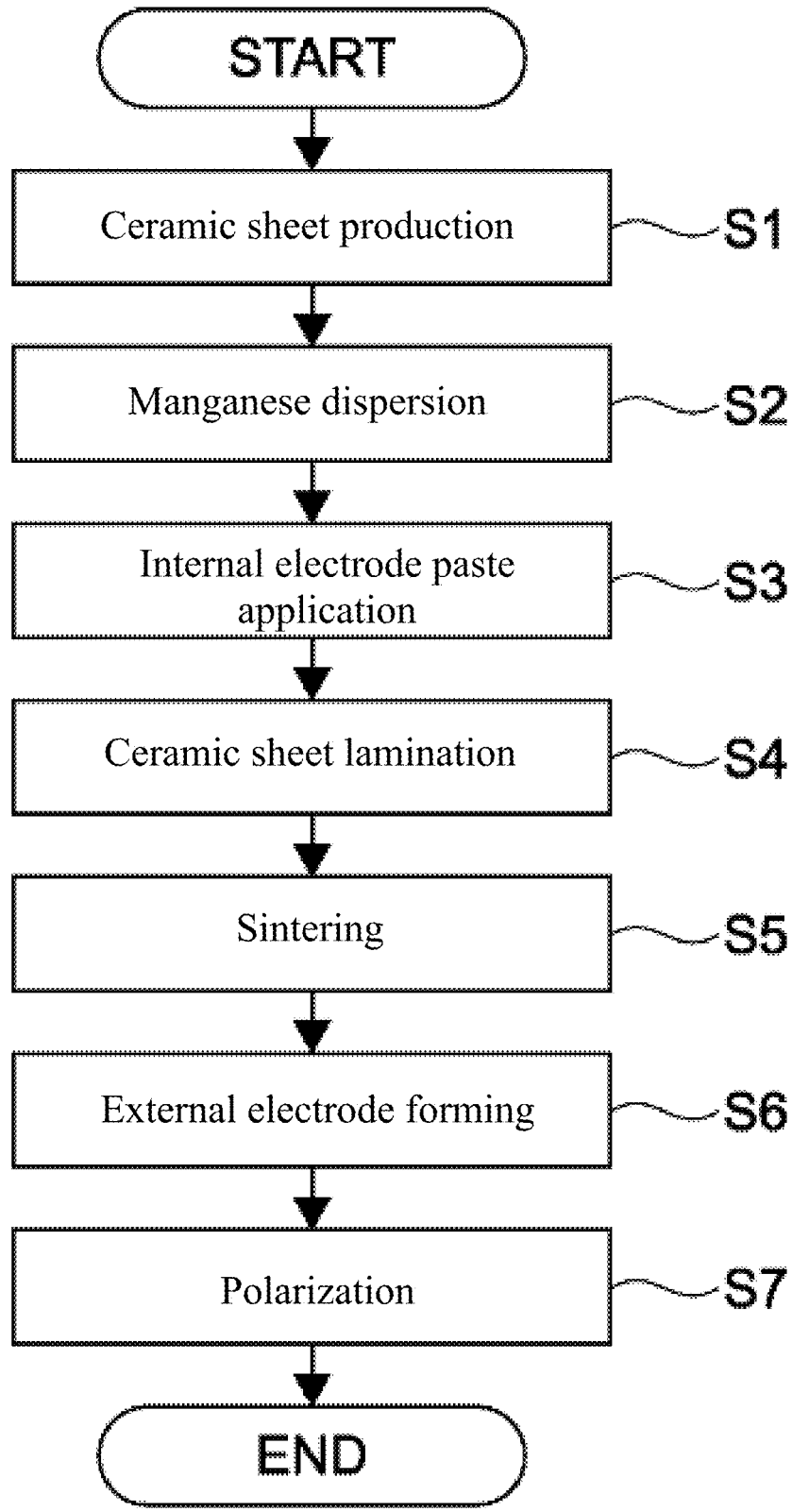
[FIG. 3] is a flow chart indicating the manufacturing method of the piezoelectric element shown in FIG. 2A.
Figure 6:
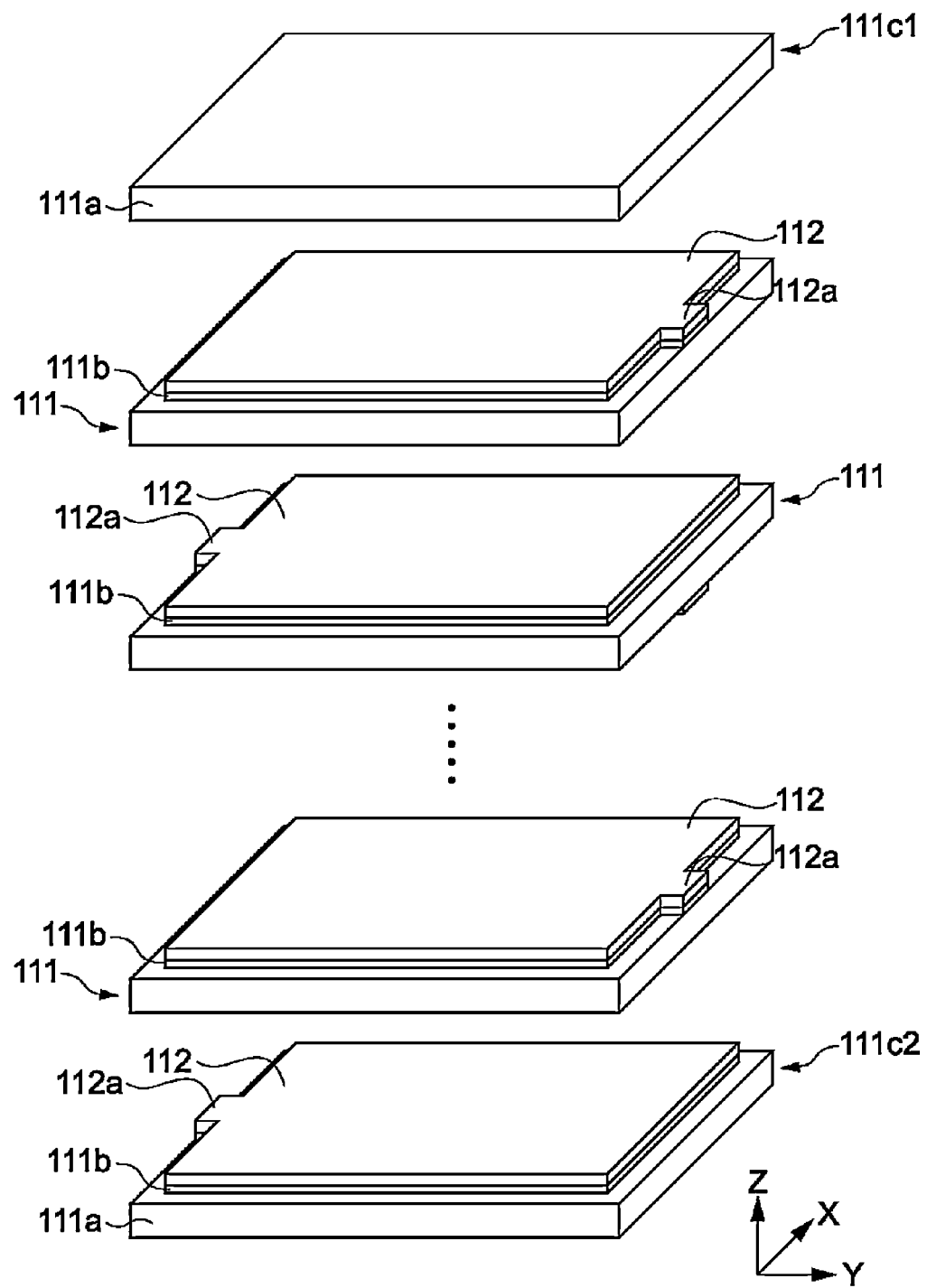
[FIG. 6] is a schematic drawing illustrating the ceramic sheet lamination step performed to make the piezoelectric element shown in FIG. 2A.

FIG. 3 is a flow chart indicating the manufacturing method of piezoelectric element 10 pertaining to this embodiment. Each step is explained below. It should be noted that, in reality, each of the following steps can be carried out on one lot comprising many piezoelectric elements. In FIGS. 4 to 6 used in the explanation below, however, production of one piezoelectric element 10 at a time is assumed as a matter of convenience for illustration purposes.

(S1) Ceramic Sheet Production Step

First, material powders are weighed to achieve the target composition. As a material powder containing lithium, lithium carbonate ($Li_2CO_3$) can be used, for example. As a material powder containing sodium, sodium carbonate ($Na_2CO_3$) or sodium hydrogen carbonate ($NaHCO_3$) can be used, for example. As a material powder containing potassium, potassium carbonate ($K_2CO_3$) or potassium hydrogen carbonate ($KHCO_3$) can be used, for example. As a material powder containing niobium, niobium pentoxide ($Nb_2O_5$) can be used, for example. As a material powder containing tantalum, tantalum pentoxide ($Ta_2O_5$) can be used, for example.

Next, the weighed material powders are mixed. The material powders are sealed in a cylindrical pot, together with ethanol and partially stabilized zirconia (PSZ) balls, and mixed using the ball mill method. After 10 hours to 60 hours of agitation using the ball mill method, ethanol is evaporated and the remaining mixture is dried to obtain a mixed powder constituted by fully mixed material powders. Under the ball mill method, other organic solvent may be used instead of ethanol.

Next, the mixed powder is calcined. Calcining is performed by holding the mixed powder in a crucible at a temperature of 700° C. to 950° C. for 1 hour to 10 hours. Then, the calcined compact is crushed using the ball mill method to obtain a calcined powder.

Here, the material powder of the element which will constitute a sub phase as mentioned above is mixed into the calcined powder as necessary. As above, the ball mill method can also be used for this mixing.

As a material powder containing manganese, manganese carbonate ($MnCO_3$), manganese monoxide (MnO), manganese dioxide ($MnO_2$), trimanganese tetraoxide ($Mn_3O_4$), or manganese acetate ($Mn(OCOCH_3)_2$) can be used, for example. As a material powder containing nickel, nickel monoxide (NiO) can be used, for example. As a material powder containing silicon, silicon dioxide ($SiO_2$) can be used, for example. As a material powder containing calcium, barium or strontium, calcium carbonate ($CaCO_3$), barium carbonate ($BaCO_3$), or strontium carbonate ($SrCO_3$) can be used, respectively, for example. As a material powder containing zirconium, zirconium oxide ($ZrO_2$) can be used, for example.

The material powder need not contain only one type of element which will become a sub phase, but it may contain two or more types of elements which will become sub phases. As a material powder containing lithium and silicon, lithium silicate ($Li_2SiO_3$) or lithium orthosilicate ($Li_4SiO_4$) can be used, for example. Additionally, as a material powder containing calcium and silicon, calcium metasilicate ($CaSiO_3$) or calcium orthosilicate ($Ca_2SiO_4$) can be used. Furthermore, as a material powder containing calcium and zirconium, calcium zirconate ($CaZrO_3$) can be used. Also, as a material powder containing strontium and zirconium, strontium zirconate ($SrZrO_3$) can be used.

Next, organic binder, dispersant, and pure water are added to the calcined powder and wet-mixed using the ball mil method to produce a ceramic slurry. The ceramic slurry is formed into a sheet shape using the doctor blade method to obtain a ceramic sheet. In the wet-mixing using the ball mill method, ethanol or other organic solvent may be used instead of pure water.

The thickness of the ceramic sheet can be controlled by the height of the blade on the doctor blade system and determined as deemed appropriate according to the structure of the piezoelectric element 10. The thickness of the ceramic sheet may be 20 μm, for example.

(S2) Manganese Dispersion Step

The manganese dispersion step is performed to form a manganese-rich phase 11b, as shown in FIG. 2B on the ceramic sheet obtained in the aforementioned step (S1).

Figure 4B:
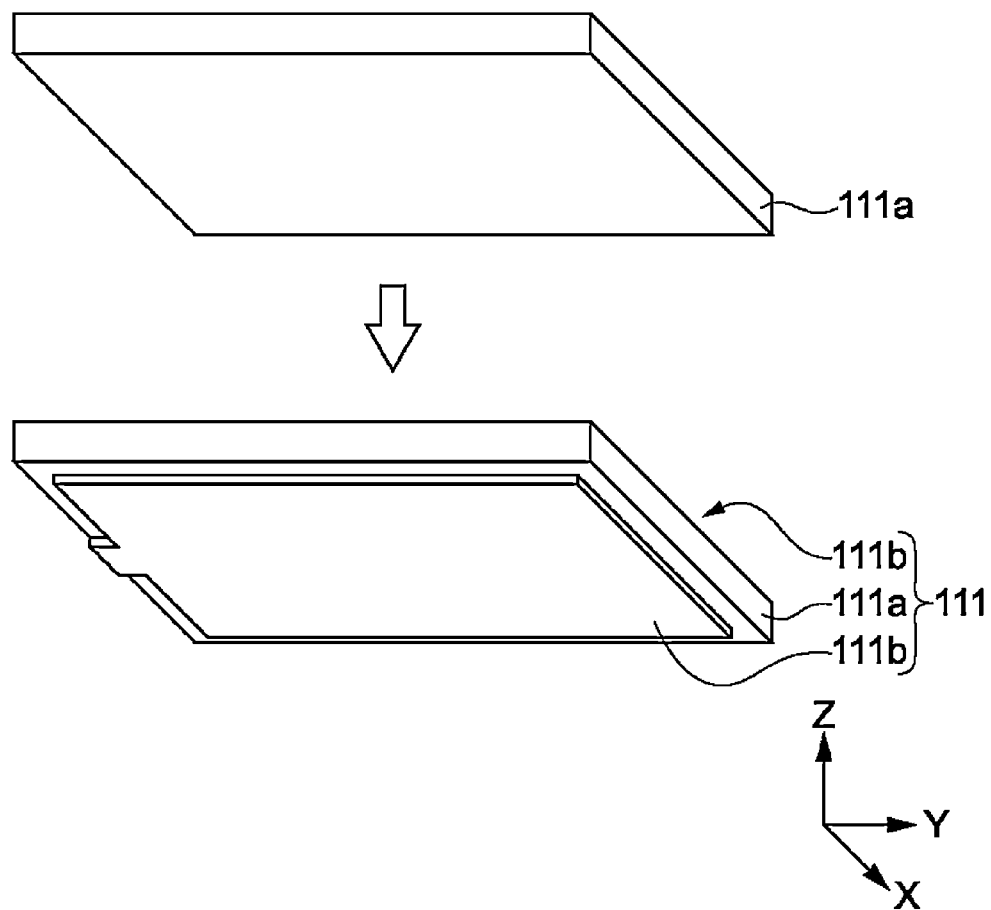
[FIG. 4B] is a schematic drawing illustrating the manganese dispersion step performed to make the piezoelectric element shown in FIG. 2A.

FIGS. 4A and 4B are schematic perspective views of the manganese dispersion step. FIG. 4A is a view from the top side in the Z-axis direction, while FIG. 4B is a view from the bottom side in the Z-axis direction. A manganese dispersion layer 111b in which manganese is uniformly dispersed is formed on both sides, in the Z-axis direction, of a ceramic sheet 111a produced in the ceramic sheet production step, to produce a complex ceramic sheet 111. The manganese dispersion layer 111b is constituted, for example, as a piezoelectric ceramic slurry whose composition contains more manganese-containing oxide than the ceramic sheet 111a does.

In FIGS. 4A and 4B, the manganese dispersion layers 111b are patterned according to the shapes of internal electrodes 12, 13 shown in FIG. 2B. The manganese dispersion layers 111b can be formed by, for example, screen-printing the prepared slurry onto the ceramic sheet 111a using screens on which the same patterns as the internal electrodes 12, 13 are formed.

The manganese-rich phase 11b is arranged in the entire area of the ceramic sheet 111a, except for its outer peripheries, and has a projection that connects to one end in the Y-axis direction. The projections on the top face and bottom face of the ceramic sheet 111a in the Z-axis direction are formed in such a way that they face the opposite sides in the Y-axis direction, respectively.

Since the manganese-rich phase 11b preferably covers the entire surfaces of the internal electrodes 12, 13 in FIG. 2B, desirably the screens to be used for the manganese dispersion layer 111b have patterns formed on them which are slightly larger than the patterns of internal electrodes 12, 13.

In addition, it is better to provide the manganese dispersion layers 111b as manganese-rich phases 11b adjacent to the internal electrodes 12, 13, which means that they can be formed over the entire surfaces on both sides of the ceramic sheet 111a. In this case, the manganese dispersion layers 111b can be formed in a sheet shape using the doctor blade method separately from the ceramic sheet 111a. Then, the sheet-shaped manganese dispersion layers 111b are overlaid on both sides of the ceramic sheet 111a.

Furthermore, the complex ceramic sheet 111 only needs to have manganese dispersed on both sides in the Z-axis direction, and need not constitute a layer like the manganese dispersion layer 111b shown in FIG. 4. For example, the complex ceramic sheet 111 may be a ceramic sheet 111a having a manganese-containing oxide powder uniformly dispersed on both sides in the Z-axis direction. In this case, a MnO fine powder can be dispersed using a sieve, for example, on both sides of the ceramic sheet 111a in the Z-axis direction.

(S3) Internal Electrode Application Step

The internal electrode application step is performed to form internal electrodes 12, 13, as shown in FIG. 2B, on the complex ceramic sheet 111 obtained in the aforementioned step (S2).

FIGS. 5A and 5B are schematic perspective views of the internal electrode application step. FIG. 5A is a view from the top side in the Z-axis direction, while FIG. 5B is a view from the bottom side in the Z-axis direction. A conductive paste (electrode paste) is applied to the top face, in the Z-axis direction, of the complex ceramic sheet 111 produced in the manganese dispersion step, to form an internal electrode film 112. The internal electrode film 112 is formed by screen-printing using a screen having internal electrode patterns formed on it.

The internal electrode film 112 is arranged in an area on the manganese dispersion layer 111b. In other words, the internal electrode film 112 is arranged in the entire area of the ceramic sheet 111a, except for its outer peripheries, and has a projection 112a that connects to one end in the Y-axis direction. These projections 112a are where the internal electrodes 12, 13 are connected to the external electrodes 14, 15. The projection 112a on the ceramic sheet 111a is formed in such a way that its width is smaller than the part of ceramic sheet 111a corresponding to the area where the internal electrodes 12, 13 face each other.

In this embodiment, where the internal electrodes 12, 13 shown in FIG. 2B are Pt electrodes, a conductive paste containing Pt was used for the internal electrode film 112. However, the conductive paste can be changed, as deemed necessary, according to the material of internal electrodes 12, 13.

Examples of internal electrodes 12, 13 other than Pt electrodes include Pd electrodes and Ag—Pd electrodes. In the cases of these other electrodes, the internal electrode film 112 is formed using a conductive paste containing Pd and conductive paste containing Ag and Pd, respectively.

In this embodiment, an internal electrode film 112 was formed as shown in FIG. 5A after manganese dispersion layers 111b were formed on both sides of the ceramic sheet 111a as shown in FIGS. 4A and 4B. However, it is sufficient that manganese dispersion layers 111b are present adjacent to both sides of the internal electrode film 112 in the subsequent ceramic sheet lamination step, and any other method can be adopted as long as the above condition is achieved.

For example, a manganese dispersion layer 111b may be formed only on the top face of the ceramic sheet 111a in the Z-axis direction. In this case, an internal electrode film 112 can be formed on the top face, in the Z-axis direction, of the manganese dispersion layer 111b formed on the top face of the ceramic sheet 111a in the Z-axis direction, after which a manganese dispersion layer 111b may be formed on the top face of this internal electrode film 112 in the Z-axis direction.

(S4) Ceramic Sheet Lamination Step

FIG. 6 is a schematic perspective view of the ceramic sheet lamination step. In the ceramic sheet lamination step, complex ceramic sheets 111 having the internal electrode film 112 obtained in the aforementioned step (S3) are laminated by a specified number of layers in such a way that their projections 112a alternately face the opposite sides in the Y-axis direction. In other words, the projections 112a of the internal electrode films 112 on the laminated ceramic sheets 111 change their direction alternately by 180° around the Z-axis.

Then, the laminate of complex ceramic sheets 111 is pressurized in the Z-axis direction, which is the laminating direction, to pressure-bond the layers into one piece. The pressure applied to the laminate of complex ceramic sheets 111 in the Z-axis direction can be determined as deemed appropriate, such as 50 MPa. By pressurizing the laminate of complex ceramic sheets 111 in the Z-axis direction this way, each complex ceramic sheet 111 deforms slightly and comes in close contact with the adjacent complex ceramic sheets 111 on its outer peripheries. As a result, the laminate of complex ceramic sheets 111 becomes one piece of rectangular solid.

Note that a ceramic sheet 111c1 constituting the top layer in the Z-axis direction has neither manganese dispersion layer 111b nor internal electrode film 112 formed on it, because there is no need to form an internal electrode film 112 on it. In addition, it is sufficient for a ceramic sheet 111c2 constituting the bottom layer in the Z-axis direction to have a manganese dispersion layer 111b formed only on its top face in the Z-axis direction, because there is no internal electrode film 112 facing its bottom face.

(S5) Sintering Step

In the sintering step, the one-piece laminate obtained in the aforementioned step (S4) is sintered. To be specific, the laminate is stored in an alumina sheath and heated to a temperature of approx. 300° C. to 500° C. to remove the binder, followed by sintering in an atmosphere at a temperature of 900° C. to 1050° C. This way a sintered compact of laminate (ceramic sintered compact) is obtained.

(S6) External Electrode Forming Step

In the external electrode forming step, external electrodes 14, 15 as shown in FIGS. 2A and 2B are formed on the ceramic sintered compact obtained in the aforementioned step (S5).

FIGS. 7A and 7B are schematic perspective views of the external electrode forming step. As shown in the top figures of FIGS. 7A and 7B, ends of internal electrodes 12, 13 formed from the aforementioned projections 112a of internal electrode films 112 are exposed in a straight line, in the Z-axis direction, on both side faces of the ceramic sintered compact 100 in the Y-axis direction. In the external electrode forming step, external electrodes 14, 15 are formed on both side faces of the ceramic sintered compact 100 in the Y-axis direction. The external electrode 14 covers one side of the ceramic sintered compact and connects all of the internal electrodes 12. The external electrode 15 covers one side of the ceramic sintered compact and connects all of the internal electrodes 13.

To be specific, a conductive paste containing Ag, etc., is applied to both sides of the ceramic sintered compact 100 in the Y-axis direction, and baked at a temperature of approx. 750° C. to 850° C. This way, external electrodes 14, 15 are formed as Ag electrodes on both sides of the ceramic sintered compact 100 in the Y-axis direction. The piezoelectric element 10 is now complete.

It should be noted that external electrodes 14, 15 need not be formed on the ceramic sintered compact 100 by means of baking. External electrodes 14, 15 may be formed using the sputtering method, vacuum deposition method, or any other thin-film forming method, for example, as long as the formed electrodes can connect the internal electrodes 12, 13, respectively, in a favorable manner.

(S7) Polarization Step

In the polarization step, the piezoelectric ceramic 11 in the piezoelectric element 10 completed in the aforementioned step (S6) is polarized so as to make the piezoelectric element 10 usable as a piezoelectric actuator, etc. Polarization is implemented by applying a high electric field between the external electrodes 14, 15 of the piezoelectric element 10. To be specific, the piezoelectric element 10 is put in silicone oil of 100° C. and an electric field of 3.0 kV/mm is applied for 15 minutes between the external electrodes 14, 15.

(Evaluation of Piezoelectric Element 10)

As the piezoelectric ceramic 11 shown in FIGS. 2A and 2B, piezoelectric ceramics in which the mol number of manganese Mn was adjusted to 0, 0.2, 0.3 and 0.4 relative to 100 mol of the main phase expressed by Composition Formula (1) were produced. Here, the piezoelectric ceramic of Mn=0 represents a comparative example of this embodiment.

(1) Evaluation by Electron Probe Micro Analyzer (EPMA)

FIGS. 8A to 8D are images of sections of piezoelectric elements 10, where FIG. 8A, FIG. 8B, FIG. 8C and FIG. 8D represent Mn=0, Mn=0.2, Mn=0.3 and Mn=0.4, respectively. The bright lines running in parallel at an equal pitch in each image represent the internal electrodes 12, 13, while bright points represent where manganese is present.

Figure 8A:
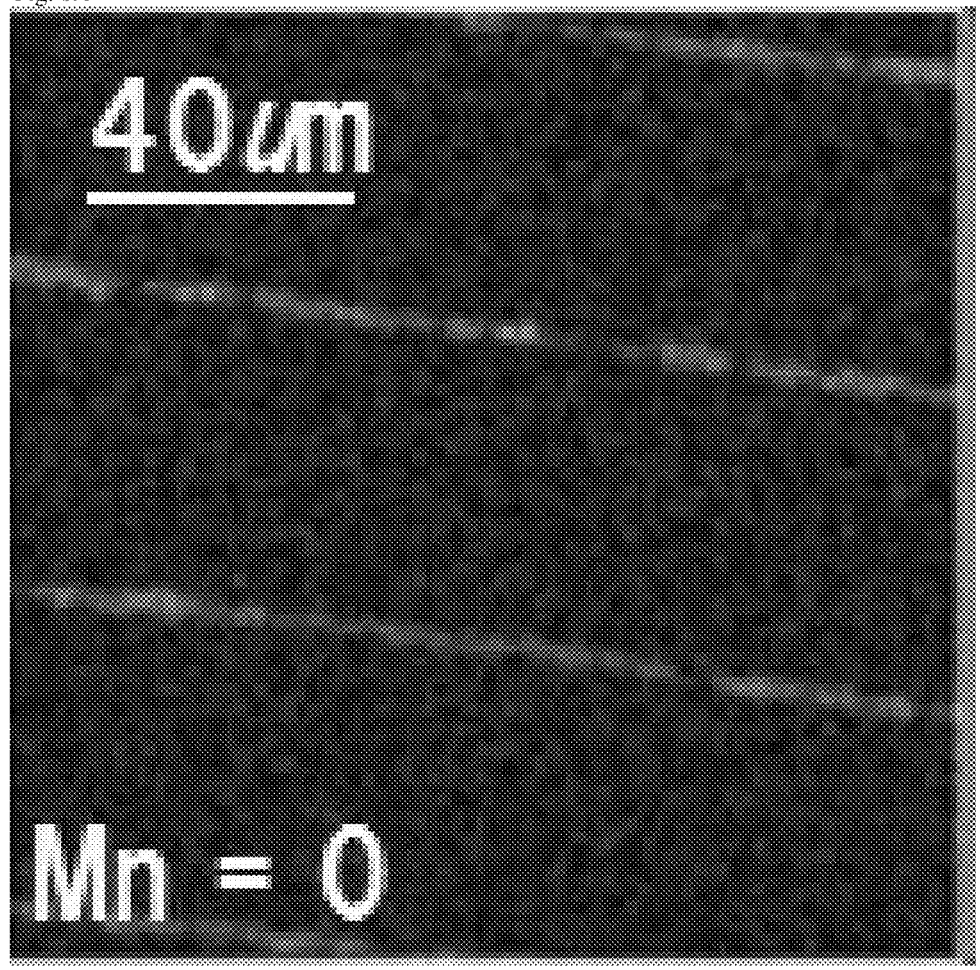
[FIG. 8A] is an EPMA-observed image of a section of a piezoelectric element when Mn=0 mol (relative to 100 mol of the main phase).
Figure 8B:
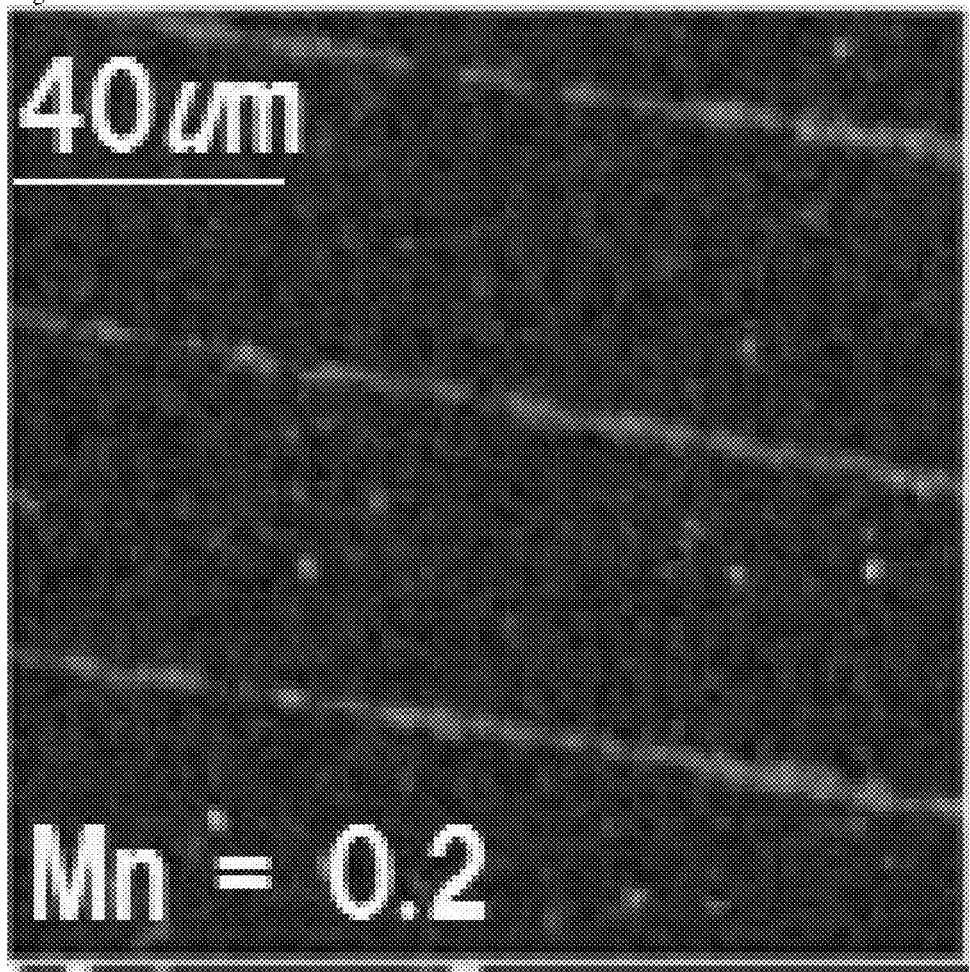
[FIG. 8B] is an EPMA-observed image of a section of a piezoelectric element when Mn=0.2 mol (relative to 100 mol of the main phase).
Figure 8C:
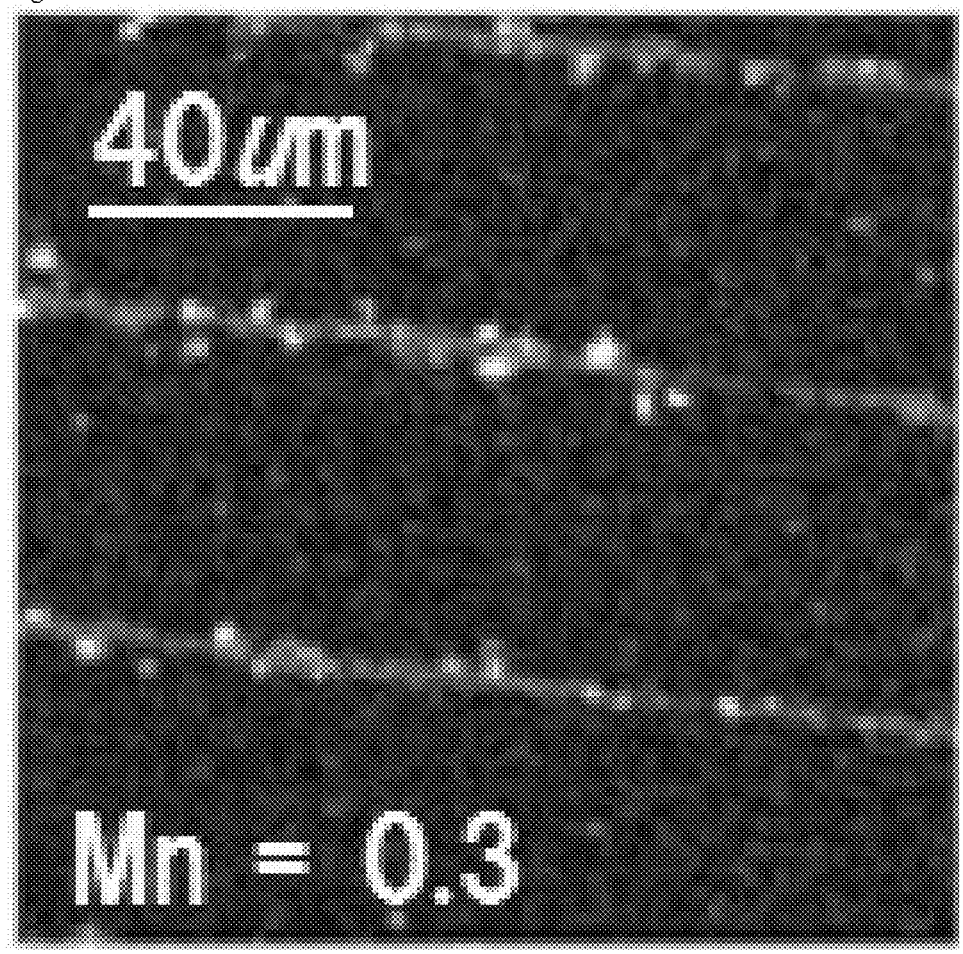
[FIG. 8C] is an EPMA-observed image of a section of a piezoelectric element when Mn=0.3 mol (relative to 100 mol of the main phase).
Figure 8D:
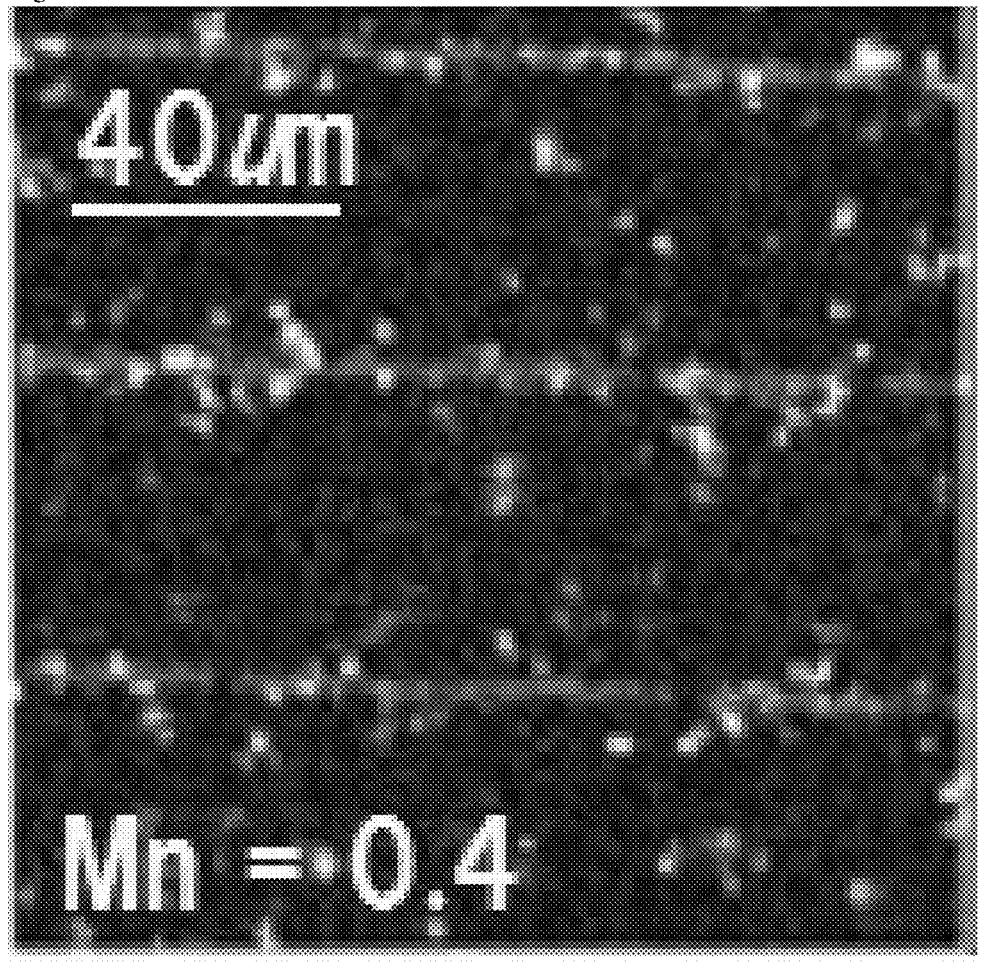
[FIG. 8D] is an EPMA-observed image of a section of a piezoelectric element when Mn=0.4.

In FIG. 8A, where Mn=0, there is no bright point. In FIGS. 8B to 8D, on the other hand, manganese is unevenly distributed near the internal electrodes 12, 13. Also from FIGS. 8B to 8D, manganese is uniformly distributed in the direction along the internal electrodes 12, 13. This trend is confirmed at Mn≤2.0.

Furthermore, detailed analyses using a TEM (transmission electron microscope), EDS (energy dispersive x-ray spectrometry), etc., for example, confirmed a clear trend that manganese would separate at the grain boundaries (including grain boundary triple points) of the main phase as crystals whose mother phase is MnO, except near the internal electrodes 12, 13, and that it would be discharged to the outer peripheries of the polycrystalline constituting the main phase. In other words, manganese was confirmed to be virtually absent inside the crystal grains constituting the main phase.

(2) Evaluation of Piezoelectric Constant $d_{33}$

Figure 9A:
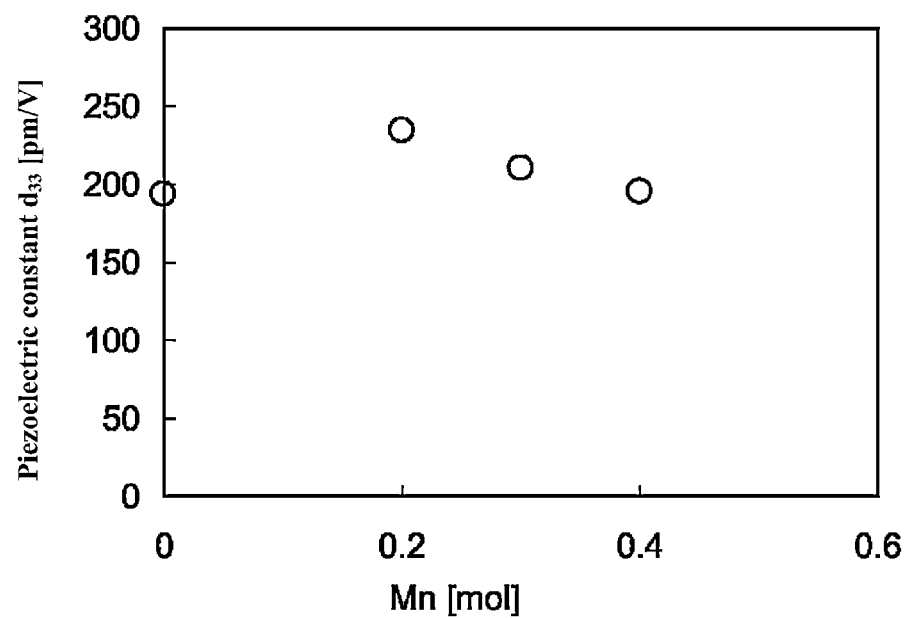
[FIG. 9A] is a graph showing how the piezoelectric constant $d_{33}$ changes relative to the content of Mn.

FIG. 9A is a graph showing the piezoelectric constants $d_{33}$ of piezoelectric ceramics 10 of Mn=0, 0.2, 0.3, and 0.4 (mol relative to 100 mol of the main phase). Measurement of piezoelectric constant $d_{33}$ used a laser Doppler displacement gauge. With all samples, a high piezoelectric constant $d_{33}$ of 200 pm/V or above was obtained. Similarly with samples of Mn≤2.0, a high piezoelectric constant $d_{33}$ of 190 pm/V or above was obtained.

This is probably due to an uneven distribution of manganese-containing oxide on the outer peripheries of the polycrystalline constituting the main phase, which prevented the Mn-containing oxide from obstructing the piezoelectric effect of the main phase.

(3) Evaluation of DC (Direct Current) Insulation Longevity

Figure 9B:
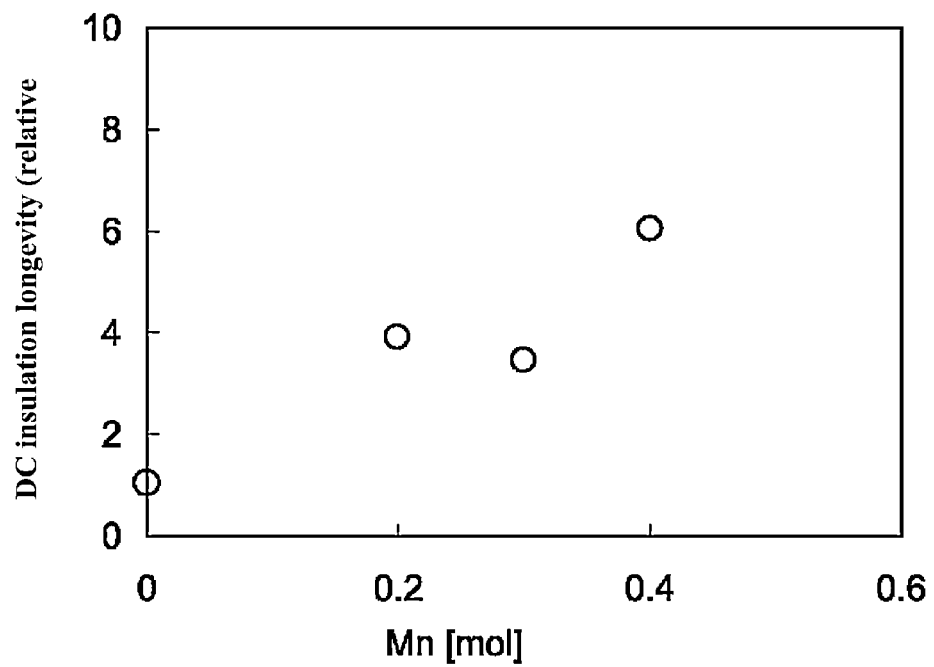
[FIG. 9B] is a graph showing how the DC insulation longevity changes relative to the content of Mn.

FIG. 9B is a graph showing the DC insulation longevity of piezoelectric ceramics of Mn=0, 0.2, 0.3, and 0.4. In this embodiment, the DC insulation longevity represents the relative time needed to achieve a current of 1 μA/cm² or more in current density after the start of application of a high DC electric field of 8 kV/mm between the external electrodes 14, 15 of the piezoelectric element at 100° C. FIG. 9B shows a normalized plot based on the AC insulation longevity at Mn=0 being 1. Measurement of DC insulation longevity used a DC ammeter-voltmeter.

The DC insulation longevity tended to increase as the content of Mn increased. The DC insulation longevity of piezoelectric elements 10 of Mn≥0.2 were sufficiently long, or at least 3.8 times the DC insulation longevity of the piezoelectric element 10 of Mn=0 to be exact. This is probably because the piezoelectric element 10 has a structure that prevents the electric field from concentrating easily, as manganese-containing oxide is unevenly distributed near the internal electrodes 12, 13 and at the outer peripheries of the polycrystalline constituting the main phase, at positions adjacent to the internal electrodes 12, 13.

(4) Evaluation of AC (Alternating Current) Longevity

Figure 9C:
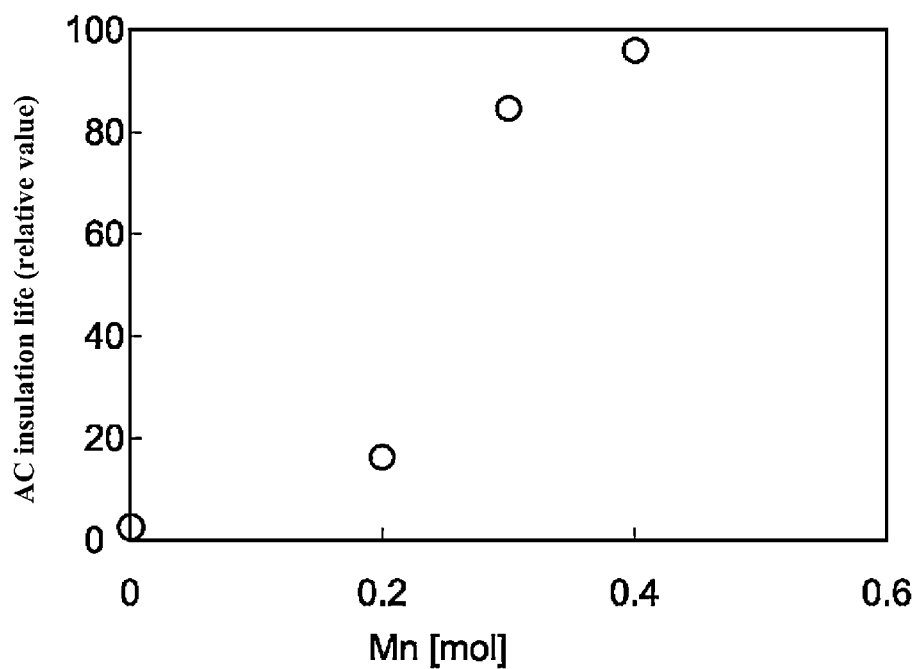
[FIG. 9C] is a graph showing how the AC insulation longevity changes relative to the content of Mn.

FIG. 9C is a graph showing the AC insulation longevity of piezoelectric ceramics 10 of Mn=0, 0.2, 0.3, and 0.4. In this embodiment, the AC insulation longevity was evaluated by driving the piezoelectric element 10 with a high AC electric field of 8 kV/mm, 100 Hz applied between the external electrodes 14, 15 of the piezoelectric element 10 at 100° C. In this embodiment, the AC insulation longevity represents the relative number of times the piezoelectric element 10 is driven until it becomes no longer drivable. FIG. 9C shows a normalized plot based on the AC insulation longevity at Mn=0 being 1. Measurement of AC insulation longevity used an oscillator, voltage amplifier, and oscilloscope.

The AC insulation longevity tended to increase as the content of Mn increased. The AC insulation longevity of piezoelectric elements 10 of Mn≥0.2 were sufficiently long, or at least 16 times the DC insulation longevity of the piezoelectric element 10 of Mn=0 to be exact. This is probably because the piezoelectric element 10 has a structure that prevents the electric field from concentrating easily, as manganese-containing oxide is unevenly distributed near the internal electrodes 12, 13 and at the outer peripheries of the polycrystalline constituting the main phase, at positions adjacent to the internal electrodes 12, 13.

(5) Summary

From the above, it was confirmed that a piezoelectric element 10 containing manganese by 0.2 mol or more but 2.0 mol or less relative to 100 mol of the main phase expressed by Composition Formula (1) would provide good piezoelectric characteristics and sufficient insulation longevity.

The foregoing explained an embodiment of the present invention, but the present invention is not at all limited to the aforementioned embodiment and various changes may be added to it so long as doing so does not deviate from the main points of the present invention.

The above embodiment explained an example where the main phase of the piezoelectric ceramics is an alkali-containing niobate perovskite structure, but the main phase of the piezoelectric ceramics may represent other piezoelectric composition having excellent piezoelectric characteristics. Examples of such piezoelectric composition include oxides of barium titanate perovskite structure and oxides of tungsten bronze structure.

The above embodiment explained an example where the main phase of the piezoelectric ceramic is an alkali-containing niobate perovskite structure, but the main phase of the piezoelectric ceramic may represent other piezoelectric compositions having excellent piezoelectric characteristics. Examples of such piezoelectric compositions include oxides of barium titanate perovskite structure and oxides of tungsten bronze structure.

The present invention includes the above mentioned embodiments and other various embodiments including the following:

1) A piezoelectric element comprising first internal electrodes and second electrodes, as well as piezoelectric ceramic layers that are made of ceramics and arranged between the first internal electrodes and second internal electrodes, wherein manganese is present relatively more abundantly in areas of the piezoelectric ceramic layers adjacent to the first internal electrodes and second internal electrodes, compared to at centers of the piezoelectric ceramic layers.

2) A piezoelectric element according to 1), wherein each of the areas extends over entire surfaces of each of the first electrodes and second electrodes.

3) A piezoelectric element according to 1) or 2), wherein the manganese is present at grain boundaries of the ceramics.

4) A piezoelectric element according to 3), wherein the manganese is present at grain boundary triple points of the ceramics.

5) A piezoelectric element according to any one of 1) to 4), wherein the piezoelectric ceramic layers have crystals containing manganese.

6) A piezoelectric element according to 5), wherein the crystals containing manganese is one whose mother phase is MnO.

7) A piezoelectric element according to 5) or 6), wherein an average grain size of the crystals containing manganese is 0.1 μm or more but 5 μm or less.

8) A piezoelectric element according to any one of 1) to 7), further comprising a first external electrode and second external electrode, wherein the first internal electrodes and second internal electrodes are alternately arranged via the piezoelectric ceramic layers, and the first internal electrodes are each connected to the first external electrode and the second internal electrodes are each connected to the second external electrode.

9) A piezoelectric element according to any one of 1) to 8), wherein a thickness of the piezoelectric ceramic layers is 10 μm or more but 60 μm or less.

10) A piezoelectric element according to any one of 1) to 9), wherein the piezoelectric ceramic layers have an alkali-containing niobate perovskite structure as a main phase.

11) A piezoelectric element according to 10), wherein the main phase is expressed by a composition formula $(Li_xNa_yK_{1-x-y})_a(Nb_{1-z}Ta_z)O_3$ (in the formula, $0.04<x\le0.1$, $0\le y\le1$, $0\le z\le0.4$, $0.95\le a\le1.01$, and $x+y<1$).

12) piezoelectric element according to 10) or 11), wherein the piezoelectric ceramic layers contain manganese at a ratio of 0.2 mol or more but 2.0 mol or less relative to 100 mol of the main phase.

13) A piezoelectric element according to any one of 10) to 12), wherein the piezoelectric ceramic layers contain silicon at a ratio of 0.2 mol or more but 3.0 mol or less relative to 100 mol of the main phase.

14) A manufacturing method of piezoelectric element, comprising:
   forming ceramic sheets containing manganese;
   dispersing crystals containing manganese on both sides of the ceramic sheets;
   applying an electrode paste to the ceramic sheets on which the crystals containing manganese has been dispersed, to form electrodes;
   laminating the ceramic sheets having the electrodes formed on them, to form a laminate; and
   sintering the laminate.

In the present disclosure where conditions and/or structures are not specified, a skilled artisan in the art can readily provide such conditions and/or structures, in view of the present disclosure, as a matter of routine experimentation. Also, in the present disclosure including the examples described above, any ranges applied in some embodiments may include or exclude the lower and/or upper endpoints, and any values of variables indicated may refer to precise values or approximate values and include equivalents, and may refer to average, median, representative, majority, etc. in some embodiments. Further, in this disclosure, an article "a" or "an" may refer to a species or a genus including multiple species, and "the invention" or "the present invention" may refer to at least one of the embodiments or aspects explicitly, necessarily, or inherently disclosed herein. In this disclosure, any defined meanings do not necessarily exclude ordinary and customary meanings in some embodiments.

The present application claims priority to Japanese Patent Application No. 2012-163598, filed Jul. 24, 2012, the disclosure of which is incorporated herein by reference in its entirety.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A piezoelectric element comprising first internal electrodes and second electrodes, as well as piezoelectric ceramic layers that are made of ceramics and arranged between the first internal electrodes and second internal electrodes, wherein manganese is present and distributed more abundantly in areas of the piezoelectric ceramic layers immediately adjacent to the first internal electrodes and second internal electrodes, than at center areas of the piezoelectric ceramic layers between and away from the first internal electrodes and second internal electrodes, wherein the piezoelectric ceramic layers have an alkali-containing niobate perovskite structure as a main phase, wherein the piezoelectric ceramic layers contain silicon at a ratio of 0.2 mol or more but 3.0 mol or less relative to 100 mol of the main phase.

2. A piezoelectric element according to claim 1, wherein the main phase is expressed by a composition formula $(Li_xNa_yK_{1-x-y})_a(Nb_{1-z}Ta_z)O_3$ (in the formula, $0.04 < x \leq 0.1$, $0 \leq y \leq 1$, $0z \leq 0.4$, $0.95 \leq a \leq 1.01$, and $x+y<1$).

3. A piezoelectric element according to Claim 2, wherein the piezoelectric ceramic layers contain manganese at a ratio of 0.2 mol or more but 2.0 mol or less relative to 100 mol of the main phase.

4. A piezoelectric element according to claim 3, wherein each of the adjacent areas extends over entire surfaces of each of the first electrodes and second electrodes.

5. A piezoelectric element according to claim 3, wherein the manganese is present at grain boundaries of the ceramics.

6. A piezoelectric element according to claim 5, wherein the manganese is present at grain boundary triple points of the ceramics.

7. A piezoelectric element according to claim 3, wherein the piezoelectric ceramic layers have crystals containing manganese.

8. A piezoelectric element according to claim 7, wherein the crystals containing manganese is one whose mother phase is MnO.

9. A piezoelectric element according to claim 7, wherein an average grain size of the crystals containing manganese is 0.1 μm or more but 5 μm or less.

10. A piezoelectric element according to claim 3, further comprising a first external electrode and second external electrode, wherein the first internal electrodes and second internal electrodes are alternately arranged via the piezoelectric ceramic layers, and the first internal electrodes are each connected to the first external electrode and the second internal electrodes are each connected to the second external electrode.

11. A piezoelectric element according to claim 3, wherein a thickness of the piezoelectric ceramic layers is 10 μm or more but 60 μm or less.

* * * * *

UNITED STATES PATENT AND TRADEMARK OFFICE
CERTIFICATE OF CORRECTION

PATENT NO.       : 9,281,465 B2
APPLICATION NO.  : 13/903737
DATED            : March 8, 2016
INVENTOR(S)      : Hiroyuki Shimizu, Keiichi Hatano and Yutaka Doshida It is certified that error appears in the above-identified patent and that said Letters Patent is hereby corrected as shown below:

Claims

At column 17, line 32, in Claim 2, in "$0z \leq 0.4$, $0.95 \leq a \leq 1.01$, and $x+y<1$", please delete "$0z \leq 0.4$" and insert therefor --$0 \leq z \leq 0.4$--.

Signed and Sealed this
Seventeenth Day of May, 2016

Michelle K. Lee
*Director of the United States Patent and Trademark Office*